United States Patent [19]

Bukowski, Jr.

[11] Patent Number: 4,775,807
[45] Date of Patent: Oct. 4, 1988

[54] SINGLE ENDED RECEIVER CIRCUIT WITH HYSTERESIS

[75] Inventor: Eugene R. Bukowski, Jr., Cary, N.C.

[73] Assignee: International Business Machines Corp., Armonk, N.Y.

[21] Appl. No.: 66,928

[22] Filed: Jun. 29, 1987

[51] Int. Cl.⁴ .................... H03K 5/153; G01R 19/165
[52] U.S. Cl. .................................... 307/359; 307/491; 307/497; 307/501; 307/304
[58] Field of Search .............. 307/359, 290, 491, 494, 307/497, 501, 304

[56] References Cited

U.S. PATENT DOCUMENTS 3,666,970  5/1972  Abbott et al. ................. 307/359
3,939,365  2/1976  Lindgren ....................... 307/359
4,092,548  5/1978  Beilstein, Jr. et al. ......... 307/304

Primary Examiner—John Zazworsky
Attorney, Agent, or Firm—Joscelyn G. Cockburn

[57] ABSTRACT

An improved on chip single ended integrated circuit receiver includes a first circuit arrangement for setting a first referenced voltage level for an incoming signal, a second circuit arrangement for generating a second referenced voltage level with hysteresis and a third circuit arrangement for correlating the incoming signal with the second referenced voltage level and outputting a signal representative of the incoming signal. The second circuit arrangement includes a four terminal MOS FET device whose substrate electrode is connected to an active node formed between a pair of MOS FET devices and controlled by the output signal from the third circuit arrangement.

7 Claims, 3 Drawing Sheets

SINGLE ENDED RECEIVER CIRCUIT WITH HYSTERESIS

BACKGROUND OF THE INVENTION

1. Field of the Invention

The present invention relates to integrated circuit technology in general and more particularly to integrated circuits for processing analog signals within the millivolt range.

2. Prior Art

The use of receiver circuits for extracting information in the form of electrical signals from a communications network is well documented in the prior art. Such receiver circuits are available as discrete components on a card or integrated components on a single chip. The integrated version of those circuits are preferred over the non-integrated version in that, among other reasons, the single chip occupies much less space than a card.

Even though the single chip receiver is attractive in many ways, it creates several technical problems which demand special and unique solutions. Oftentimes, the problems are created as a result of the environment in which the chip is used. If the chip is used to process digital signals, the problem is minuscule since a purely digital process, such as CMOS, can be used to fabricate it. However, when the chip is used to process mixed signals (analog and digital) the problem is how to use digital components and a digital processing technique, such as CMOS, to provide both analog and digital functions on a single chip.

There are several environments in which the signals to be processed are within the millivolt range. As will be explained subsequently, such small signals raise additional problems which must be cared for if the integrated chip is designed for use in these environments. Thus, the concern is not only providing the analog and digital function on a single chip but also processing signals within the millivolt range. Among the environments in which such small analog signals are prevalent is the Local Area Network espoused by IEEE 802.5 Committee (IEEE Standard Token Ring ANSI/IEEE Standard 8802/2 and 5 - 1985). Details of the network are set forth therein and are incorporated herein by reference.

Designing the single chip so that the receiver circuit can be used in noisy environments present another problem for the designer. It is well known that hysteresis, provided by a Schmitt trigger, can be used to make a receiver circuit immune to noise. Essentially, the hysteresis phenomenon, be it introduced by a Schmitt trigger or other types of electrical circuits, sets the switching point for an output signal. Even though the hysteresis phenomenon is well known, the problem is how to implement it on a single chip with mixed functions (analog and digital). The prior art has introduced hysteresis characteristics with resistors, lamda diodes and extraneous process steps. All of the prior art techniques increase the overall cost of the chip.

SUMMARY OF THE INVENTION

It is therefore the main object of the present invention to provide a more efficient receiver circuit than was heretofore possible.

It is another object of the present invention to provide a receiver circuit that is easily integrated with other circuits on a chip using a digital CMOS process.

The receiver circuit includes a four-terminal FET device whose substrate terminal is connected to an active node. As the voltages at the active node change, the value of the threshold voltage ($V_tT$) of the FET also change. The variable threshold voltage is used to set the switch point (hysteresis) in the receiver circuit.

More particularly, a voltage divider network, form from series connected FET devices, is placed in the path of an incoming signal. The voltage divider network sets the d.c. voltage level about which the incoming a.c. signal swings. The adjusted signal from the divider network is fed to a negative input terminal of a comparator network. A reference signal, with hysteresis form from a hysteresis voltage setting generating network, is applied to the postive terminal of the comparator network. The comparator network correlates the signals at its respective input and outputs a modified signal representative of the incoming signal.

The hysteresis voltage setting generating network includes a first and a second pair of series connected FET devices. Either the first or the second pair of FET devices is used to generate an active node. The output of the comparator is connected to the gate electrode or terminal of one of the devices used to form the active node. The substrate electrode of one of the FET devices in the other pair is connected to the active node.

These and other features and advantages of this invention will be more fully described in the accompanying drawings.

DETAILED DESCRIPTION OF THE PREFERRED EMBODIMENT

Figure 1A:
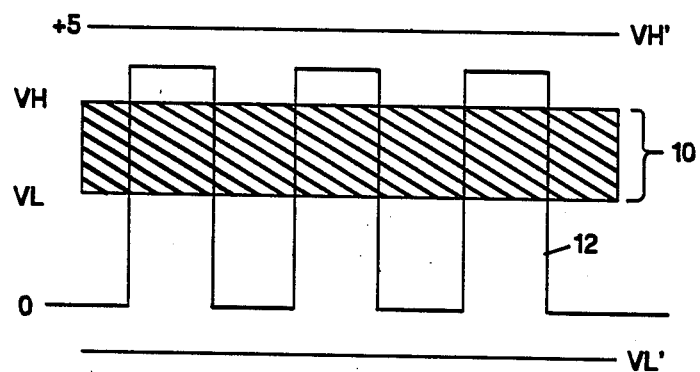
FIGS. 1A and 1B show graphical representations of the interaction between incoming signals and reference level signals with hysteresis. The figures are helpful in understanding the problems to be overcome in designing a circuit to process small analog signals.
Figure 1B:
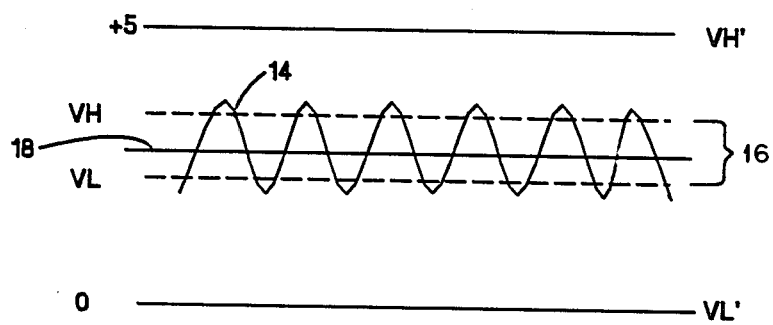

FIGS. 1A and 1B show graphical representations for hysteresis windows and input signals associated with prior art circuits and the circuits for the present invention. These graphs are helpful in understanding the reasons why prior art circuits are not suitable for processing small signals.

FIG. 1A shows the prior art graphs which are comprised of hysteresis window 10, input signal 12 and the maximum range of voltage levels ($V_L'$ and $V_H'$) available in a CMOS process. $V_L'$ represents a low voltage level for the power supply while $V_H'$ represents a high voltage level. Usually, the maximum range of voltages are 0V and +5V. The hysteresis window also has two levels identified by $V_L$ and $V_H$. $V_L$ represents the low switch point while $V_H$ represents a high switch point. As stated previously, $V_L$ and $V_H$ are the switching points at which an output signal (not shown) changes state. As is evident from the graph, the input signal 12 has sufficient swing or amplitude to intersect $V_L$ and $V_H$ no matter where they are positioned between the power supply range 0 through +5. Also, the width of the hysteresis window 10 is relatively wide. As a result, it can be stated that the prior art circuitry is characterized with wide hysteresis windows and handle large input signals.

In contrast, FIG. 1B shows a graphical representation of small signals which the present invention is designed to process. As is used in this document, small signal means a signal whose peak-to-peak amplitude falls within the millivolt range. Similar to FIG. 1A, the available voltage levels supplied by the single rail power supply are 0 through +5V. Unlike the prior art, the amplitude or swing of input signal 14 is relatively small (that is, within the millivolt range). In order to process input signals with relatively small amplitude as signal 14, one has to generate a narrow hysteresis curve 16 and an a.c. ground (ACG) reference signal 18 about which the small analog signal swings. As with FIG. 1A, $V_L$ and $V_H$ represent the low voltage level and high voltage level for hysteresis window 16.

Figure 2:
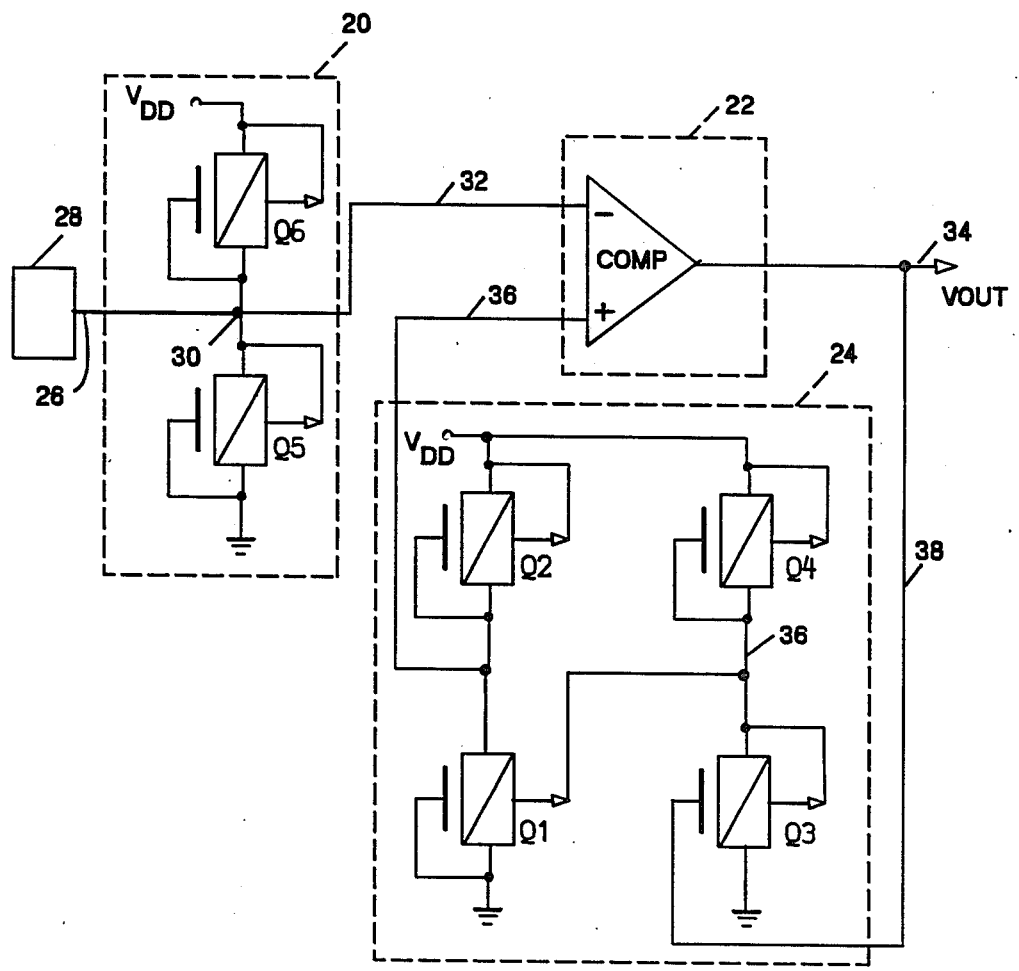
FIG. 2 shows a circuit diagram for a single ended receiver according to the teachings of the present invention.

FIG. 2 shows a circuit schematic of a single-ended receiver according to the teaching of the present invention. The circuit is well suited for integration with other circuits on a single chip using the CMOS technology. As stated previously, this technology is primarily a digital technology and the digital components are used to provide a circuit for processing small analog signals. The circuit is ideally suited for handling small analog signals outputted from local area networks which are designed designs in accordance with the IEEE 802.5 standards.

Still referring to FIG. 2, the circuit for processing small signals is comprised of a.c. ground reference voltage generating means 20, comparator means 22 and hysteresis reference voltage generating means 24. The a.c. ground reference voltage generating means is coupled by conductor 26 to pad 28. Pad 28 and all circuit arrangements to the right of pad 28 are integrated on a single chip. The incoming signals to be processed by the circuit arrangement of the present invention are coupled into pad 28. Conventional devices such as transformers and/or capacitors (not shown) are used for coupling the incoming signal into the chip. Since these devices are well known in the prior art and do not form part of the present invention, further description will not be given in this document.

Still referring to FIG. 2, a.c. ground reference generator means 20 sets the a.c. ground level (ACG) about which an incoming signal swings. The a.c. ground reference voltage generator means includes FET devices Q5 and Q6. It should be noted that all the FET devices used in this single ended amplifier with hysteresis are P-channel devices. These devices are identified with a rectangular body and a diagonal. Also, the FET devices are four terminal devices in which the substrate terminals are shown with arrows. It should be noted that other types of FET devices can be used to practice the invention.

Devices Q5 and Q6 are connected in series via their drain and source electrodes. The substrate terminals of Q5 and Q6 are connected to their respective source electrodes. The source electrode of device Q6 is tied to Vdd. Vdd is the high voltage level supplied from the single rail power supply. As previously stated, in CMOS technology Vdd is +5 V. The gate terminals of FET devices Q5 and Q6 are connected to their respective drain terminal. In the preferred embodiment of this invention device Q5 and device Q6 are identical; thus the voltage which is generated at node 30 is equivalent to Vdd/2. Node 30 is connected by conductor 32 to the negative input terminal of comparator 22. Comparator 22 compares the signal at its negative input terminal with the signal (to be described hereinafter) at its positive input terminal and outputs a signal $V_{out}$ on conductor 34. The signal on conductor 34 is a digital signal representing the input signal provided at pad 28. The signal on pad 28 is provided by another machine (not shown) which is coupled to the communications network (not shown).

Still referring to FIG. 2, hysteresis reference voltage generating means 24 generates a signal with hysteresis and forwards the signal on conductor 36 to the positive input terminal of comparator 24. As stated above, the hysteresis window of the signal must be relatively narrow and is located at the a.c. ground formed by P-channel enhancement mode FET devices Q5 and Q6. The reference voltage signal with hysteresis is generated from enhancement mode FET devices Q1, Q2, Q3 and Q4. FET devices Q3 and Q4 are connected in series between ground potential and Vdd. The substate terminals of Q3 and Q4 are connected to their respective source terminal. The control gate or terminal of FET device Q3 is connected via conductor 38 to the output of comparator 22. The gate terminal fo FET device Q4 is connected to its drain terminal. As the output signal $V_{out}$ on conductor 34 changes, the voltage at active node 36 changes which in turn changes the voltage to the substrate terminal of FET device Q1. As the substrate voltage of FET Q1 changes, the threshold voltage of the device also changes, thus providing a relative narrow hysteresis window. The gate terminal of FET device Q1 is connected to the drain terminal. Similarly, with FET device Q2 the gate terminal is tied to its drain terminal while its substate terminal is tied to the source terminal. Preferably, the FET devices of FIG. 2 are P-channel enhancement mode devices with identical W/L ratios (where W is the width of a device and L is the length).

Figure 3:
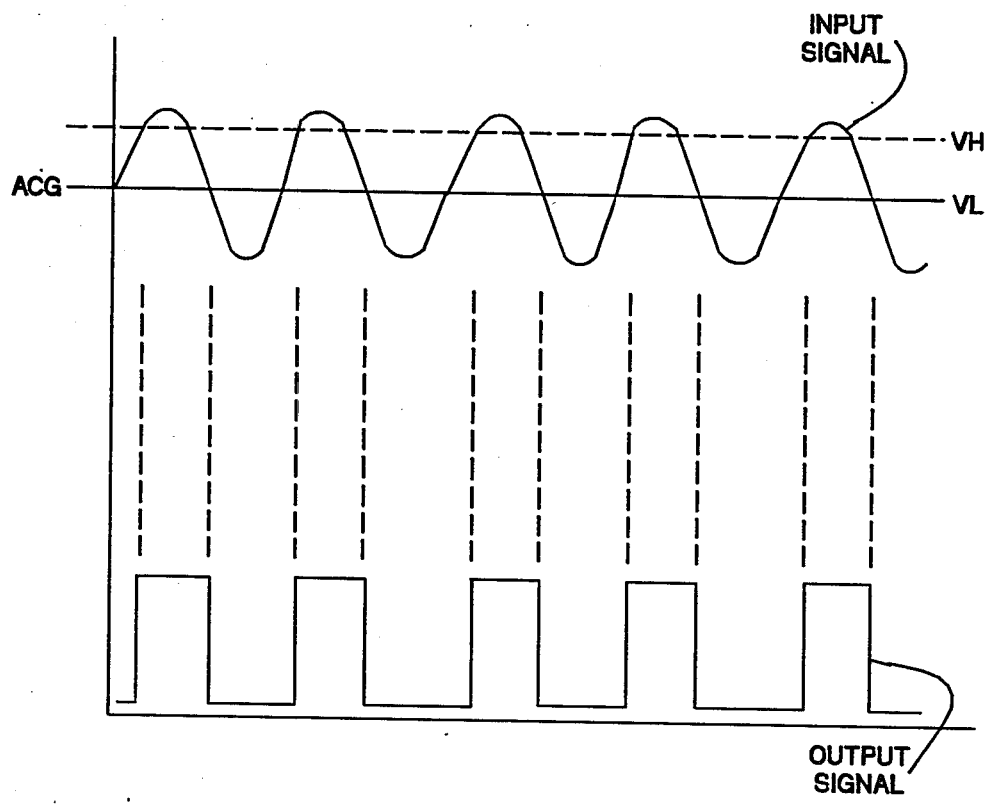
FIG. 3 shows a schematic of the signals generated at various sections of the circuit of FIG. 2.

FIG. 3 shows plots of signals derived at different points of the circuit in FIG. 2. These plots are helpful in understanding how the circuit in FIG. 2 operates. The input signal in FIG. 3 is that signal which is inputted on pad 28. The a.c. ground (ACG) line represents the reference voltage level which is generated from a.c. reference voltage generating means 20. $V_L$ and $V_H$ signify the boundaries of the hysteresis window generated from hysteresis reference voltage generating means 24. These boundaries define the switch point for the output signal. The output signal is generated by the comparator on conductor 34. It should be noted that the output signal is formed by interconnecting the switch point where the input signal intersects $V_H$ and $V_L$. By utilizing the circuit set forth in FIG. 2, a bilevel signal can be generated from small signals.

Although the foregoing invention has been particularly shown and described with reference to the preferred embodiment thereof, it will be understood by those skilled in the art that other changes in form may be made without departing from the spirit and scope of the invention.

What is claimed is:

1. A circuit arrangement for receiving signals from a communications network comprising:
    a comparator circuit means having an output terminal and a pair of input terminals;
    a first circuit means for generating a reference voltage connected to an input terminal;
    said first circuit means including a first and a second pair of series connected FET devices with a substrate terminal of an FET in the first pair connected to a node between the FET devices of the second pair;

means for interconnecting the output terminal to a control terminal of one of the FET devices in said second pair; and a second circuit means for setting a d.c. voltage reference level for an incoming signal connected to another input terminal of said comparator circuit means.

2. The circuit arrangement of claim 1 wherein the second circuit means includes a pair of FET devices connected in series with a substrate terminal on each FET device connected to its source terminal and the control terminal of each FET device connected to its drain terminal.

3. A circuit arrangement for generating a reference voltage with hysteresis comprising:

a power supply which generates a single voltage level;

a first pair of series connected FET devices connected between the single voltage level and a ground reference potential with an output node being disposed between the FET devices; a second pair of series connected FET devices positioned in parallel to the first pair and connected between the single voltage level and the ground potential with an active node being formed between the FET devices of the second pair;

means interconnecting a substrate terminal of an FET device in said first pair to the active node formed between the FET devices of the second pair; and a control circuit having an output connected to a gate terminal of an FET device of the second pair of series connected FET devices; said control circuit correlating a signal at the output node with an input signal to provide a control signal which drives the gate terminal so that a variable voltage is provided at the active node.

4. The circuit arrangement of claims 1 or 3 wherein the FET devices are P-channel type devices.

5. The circuit arrangement of claim 4 wherein the width to length ratio of the Pchannel type device is identical.

6. An improved receiver circuit for integrating on a semiconductor chip with a CMOS process comprising:

a first terminal for receiving an input signal;

a second terminal for connecting to a power supply;

a voltage divider circuit means including a pair of series connected FET devices with each device having its substrate and source electrodes connected and its gate and drain electrode connected for generating a d.c. reference voltage level connected to the first terminal;

a comparator circuit means having first and second input terminals and an output terminal;

first means for interconnecting the voltage divider circuit means to the first input terminal of the comparator circuit means;

second means for generating a reference signal with narrow hysteresis voltage levels connected between the second terminal and a ground reference potential;

means for coupling the output terminal of said comparator circuit means to the second means; and means for interconnecting the second means to said second input terminal of the comparator circuit means.

7. The improved receiver circuit of claim 6 wherein the second means includes a first and a second pair of series connected FET devices with a substrate electrode of a first device connected to an active node formed by two FETs and a fourth FET connected to a source electrode of the first device and setting on said source electrode a voltage which is $\leq$ a voltage on the active node.

* * * * *